US010457788B2

(12) United States Patent
Tsumagari et al.

(10) Patent No.: US 10,457,788 B2
(45) Date of Patent: Oct. 29, 2019

(54) GAS-BARRIER MULTILAYER FILM

(75) Inventors: Yumi Tsumagari, Inuyama (JP); Yoji Takatsu, Inuyama (JP); Kyoko Inagaki, Inuyama (JP); Takeshi Okawa, Inuyama (JP); Yoshiharu Morihara, Inuyama (JP); Syuusei Matsuda, Osaka (JP)

(73) Assignee: TOYO BOSEKI KABUSHIKI KAISHA, Osaka (JP)

( * ) Notice: Subject to any disclaimer, the term of this patent is extended or adjusted under 35 U.S.C. 154(b) by 0 days.

(21) Appl. No.: 13/517,196

(22) PCT Filed: Dec. 22, 2010

(86) PCT No.: PCT/JP2010/073160
§ 371 (c)(1),
(2), (4) Date: Jun. 19, 2012

(87) PCT Pub. No.: WO2011/078232
PCT Pub. Date: Jun. 30, 2011

(65) Prior Publication Data
US 2012/0270058 A1 Oct. 25, 2012

(30) Foreign Application Priority Data
Dec. 24, 2009 (JP) ................................. 2009-293446

(51) Int. Cl.
B32B 27/18 (2006.01)
B32B 9/04 (2006.01)
B32B 27/28 (2006.01)
C08J 7/04 (2006.01)
H01L 31/049 (2014.01)

(52) U.S. Cl.
CPC ............ *C08J 7/045* (2013.01); *H01L 31/049* (2014.12); *C08J 2423/08* (2013.01); *C08J 2429/04* (2013.01); *Y02E 10/50* (2013.01); *Y10T 428/31663* (2015.04); *Y10T 428/31667* (2015.04); *Y10T 428/31938* (2015.04)

(58) Field of Classification Search
None
See application file for complete search history.

(56) References Cited

U.S. PATENT DOCUMENTS

| | | | |
|---|---|---|---|
| 5,766,751 A | 6/1998 | Kotani et al. | |
| 5,770,301 A | 6/1998 | Murai et al. | |
| 5,942,298 A * | 8/1999 | Sakaya et al. | 428/36.6 |
| 6,146,750 A | 11/2000 | Kotani et al. | |
| 6,165,574 A | 12/2000 | Bentmar et al. | |
| 6,316,093 B1 | 11/2001 | Kotani et al. | |
| 6,426,135 B1 | 7/2002 | Kotani et al. | |
| 6,569,533 B1 * | 5/2003 | Uchida et al. | 428/423.1 |
| 7,811,669 B2 | 10/2010 | Fujii et al. | |
| 8,434,637 B2 | 5/2013 | Mita et al. | |
| 2004/0191552 A1 | 9/2004 | Nakamura et al. | |
| 2005/0084686 A1 * | 4/2005 | Imaizumi | C08G 18/0823 428/425.5 |
| 2005/0214530 A1 * | 9/2005 | Tanaka et al. | 428/347 |
| 2006/0062995 A1 * | 3/2006 | Yamamoto | B32B 27/08 428/332 |
| 2007/0224402 A1 | 9/2007 | Yoshida et al. | |
| 2007/0269664 A1 | 11/2007 | Fujii et al. | |
| 2009/0022981 A1 | 1/2009 | Yoshida et al. | |
| 2009/0029854 A1 | 1/2009 | Maruyama et al. | |
| 2009/0035424 A1 | 2/2009 | Mita et al. | |
| 2009/0130368 A1 | 5/2009 | Beihoffer et al. | |
| 2009/0148640 A1 * | 6/2009 | Yoshida et al. | 428/36.6 |
| 2009/0181244 A1 * | 7/2009 | Fukugami | B32B 27/08 428/336 |
| 2010/0015431 A1 * | 1/2010 | Matsui et al. | 428/323 |
| 2012/0128956 A1 | 5/2012 | Takatsu et al. | |

FOREIGN PATENT DOCUMENTS

| | | |
|---|---|---|
| EP | 1 561 840 A1 | 8/2005 |
| JP | 7-251475 A | 10/1995 |
| JP | 10-86268 A | 4/1998 |
| JP | 2929609 B2 | 5/1999 |
| JP | 11-314320 A | 11/1999 |
| JP | 2000-043182 A | 2/2000 |
| JP | 2000-052499 A | 2/2000 |
| JP | 2000-071395 A | 3/2000 |
| JP | 2000-263727 A | 9/2000 |
| JP | 2001-519739 A | 10/2001 |
| JP | 2002-178440 A | 6/2002 |
| JP | 2002-249565 A | 9/2002 |

(Continued)

OTHER PUBLICATIONS

English Abstract of JP 2000-006342, Izeki et al., Jan. 2001.*
Japanese Patent Office, Notice of Reasons for Rejection in Japanese Patent Application No. 2009-179154 (dated Feb. 26, 2013).
Japanese Patent Office, International Search Report in International Patent Application No. PCT/JP2010/073160 (dated Apr. 5, 2011).
European Patent Office, Extended European Search Report in European Patent Application No. 10839462.8 (dated Nov. 29, 2013).
European Patent Office, Extended European Search Report in European Patent Application No. 10804423.1 (dated Dec. 18, 2013).

(Continued)

*Primary Examiner* — Ronak C Patel
(74) *Attorney, Agent, or Firm* — Leydig, Voit & Mayer, Ltd.

(57) ABSTRACT

A gas-barrier multilayer film, wherein (A) a first inorganic thin film layer, (C) a gas-barrier resin composition layer, and (D) a second inorganic thin film layer are stacked in this order with or without intervention of other layers on at least one surface of a plastic film, the gas-barrier resin composition layer (C) is formed from a gas-barrier resin composition comprising (a) a gas-barrier resin including an ethylene-vinyl alcohol-based copolymer, (b) an inorganic layered compound, and (c) at least one additive selected from coupling agents and crosslinking agents, and the content of the inorganic layered compound (b) in the gas-barrier resin composition is from 0.1% by mass to 20% by mass based on 100% by mass in total of the gas-barrier resin (a), the inorganic layered compound (b), and the additive (c).

12 Claims, No Drawings

(56) References Cited

FOREIGN PATENT DOCUMENTS

| JP | 3441594 B2 | 6/2003 |
|---|---|---|
| JP | 2004-175011 A | 6/2004 |
| JP | 2004-262143 A | 9/2004 |
| JP | 3681426 B2 | 8/2005 |
| JP | 2005-288948 A | 10/2005 |
| JP | 2005-324361 A | 12/2005 |
| JP | 2005-349769 A | 12/2005 |
| JP | 2006-056007 A | 3/2006 |
| JP | 2006-056927 A | 3/2006 |
| JP | 2007-290144 A | 11/2007 |
| JP | 2007-290292 A | 11/2007 |
| JP | 2008-200975 A | 9/2008 |
| JP | 2008-297527 A | 12/2008 |
| JP | 2009-006508 A | 1/2009 |
| JP | 2009-248456 A | 10/2009 |
| JP | 2009-289945 A | 12/2009 |
| JP | 5434341 B2 | 3/2014 |
| WO | WO 2006/107048 A1 | 10/2006 |
| WO | WO 2007/034773 A1 | 3/2007 |
| WO | WO 2007/040609 A1 | 4/2007 |

OTHER PUBLICATIONS

Japanese Patent Office, Notice of Reasons for Rejection in Japanese Patent Application No. JP 2010-073683 (dated Oct. 15, 2013).

Japanese Patent Office, International Search Report in International Patent Application No. PCT/JP2010/062642 (dated Sep. 21, 2010).

Japanese Patent Office, Notification of Reasons for Rejections in Japanese Patent Application No. 2010-285042 (dated Jun. 24, 2014).

Japanese Patent Office, Office Action in Japanese Patent Application No. 2011-066789 (dated Oct. 14, 2014).

Japanese Patent Office, Office Action in Japanese Patent Application No. 2011-066790 (dated Oct. 14, 2014).

Japanese Patent Office, Office Action in Japanese Patent Application No. 2011-066788 (dated Nov. 25, 2014).

U.S. Appl. No. 13/388,227, filed Jan. 31, 2012.

European Patent Office, Communication pursuant to Article 94(3) EPC in European Patent Application No. 10839462.8 (dated Mar. 8, 2017).

* cited by examiner

_gas-barrier multilayer film_

GAS-BARRIER MULTILAYER FILM

CROSS-REFERENCE TO RELATED APPLICATIONS

This patent application is the U.S. national phase of International Patent Application No. PCT/JP2010/073160, filed Dec. 22, 2010, which claims the benefit of Japanese Patent Application No. 2009-293446, filed Dec. 24, 2009, which are incorporated by reference in their entireties.

TECHNICAL FIELD

The present invention relates to a gas-barrier multilayer film that is transparent, has superior barrier properties against water vapor, oxygen, and the like, is useful as a film for packaging various foodstuffs, drugs, industrial products, and the like and can be used suitably in industrial applications such as solar batteries, electronic paper, organic EL elements, and semiconductor elements in which long-term stable gas-barrier properties and durability are requested. Particularly, the present invention relates to a gas-barrier multilayer film that can exhibit good gas-barrier properties and adhesion properties (lamination strength) even if it is exposed to a high-temperature and high-humidity environment for a long term or subjected to a retort treatment.

Conventionally known gas-barrier films include films in which thin films of metal such as aluminum or thin films of inorganic oxides such as silicon oxide and aluminum oxide have been laminated on the surface of a plastic film. In particular, films in which thin films of inorganic oxides such as silicon oxide, aluminum oxide, and a mixture thereof has been laminated have been used widely for food applications because they are transparent and contents can be checked therethrough.

However, in the film in which such inorganic thin films laminated, pinholes, cracks and so on are easily formed during a thin film formation step and cracks of the inorganic thin film layers are easily formed during a processing step, and because of this, desired sufficiently high gas-barrier properties have not been obtained. Then, as a method for improving such defects, an attempt to further form a gas-barrier layer on an inorganic thin film has been made. For example, a gas-barrier film in which an inorganic thin film has been coated with a resin layer containing an inorganic layered compound having a specific particle diameter and a specific aspect ratio has been disclosed (Patent Document 1).

In addition, many films in which the surface of a plastic film has been coated with a resin composition having high gas-barrier properties have been proposed. As to resin compositions to be used for such films, a method that involves dispersing a flat inorganic substance such as an inorganic layered compound in a resin compositions has also been known as a method for improving gas-barrier properties; for example, a product in which a barrier coating layer composed of an ethylene-vinyl alcohol-based copolymer, a water-soluble zirconium-based cross-linking agent, and an inorganic layered compound has been formed on a substrate film has been proposed (Patent Document 2).

By the use of these methods, however, improvement in properties during boiling or under high-humidity can be recognized, but gas-barrier properties have not been obtained which are high enough for resisting prolonged use under a high-temperature and high-humidity environment that are necessary as industrial applications such as solar batteries and electronic paper. Moreover, gas-barrier properties and lamination strength after retorting have not reached a satisfactory level and gas-barrier films of stable quality have not been obtained yet.

PRIOR ART DOCUMENTS

Patent Documents

Patent Document 1: Japanese Patent No. 3681426
Patent Document 2: JP 2008-297527 A

SUMMARY OF THE INVENTION

Problems to be Solved by the Invention

The present invention has been made in consideration of the problems of these conventional technologies. That is, an object of the present invention is to provide a gas-barrier multilayer film being superior in gas-barrier properties and interlayer adhesion property, and being usable for applications as well as industrial applications, such as solar batteries, electronic papers, organic EL devices, and semiconductor devices. In particular, the invention intends to provide a gas-barrier multilayer film that exhibits less deterioration in gas-barrier properties and is resistant to interlayer delamination even in prolonged exposure to high-temperature and high-humidity environment or after a retort treatment.

Means for Solving the Problems

The gas-barrier multilayer film of the present invention that has solved the above problem is characterized, wherein (A) a first inorganic thin film layer, (C) a gas-barrier resin composition layer, and (D) a second inorganic thin film layer are stacked in this order with or without intervention of other layers on at least one surface of a plastic film, the gas-barrier resin composition layer (C) is formed from a gas-barrier resin composition comprising (a) a gas-barrier resin including an ethylene-vinyl alcohol-based copolymer, (b) an inorganic layered compound, and (c) at least one additive selected from coupling agents and crosslinking agents, and the content of the inorganic layered compound (b) in the gas-barrier resin composition is from 0.1% by mass to 20% by mass based on 100% by mass in total of the gas-barrier resin (a), the inorganic layered compound (b), and the additive (c).

The inorganic layered compound (b) is preferably smectite.

It is preferred that the first inorganic thin film layer (A) and/or the second inorganic thin film layer (D) comprises a multi-component inorganic oxide containing silicon oxide and aluminum oxide.

In the event that a coupling agent is used as the additive (c), the coupling agent is preferably a silane coupling agent having one or more kinds of organic functional groups. In the event that a crosslinking agent is used as the additive (c), the crosslinking agent is preferably a crosslinking agent for a group capable of forming a hydrogen bond. The content of the additive (c) (the overall content for the event that both a coupling agent and a crosslinking agent are contained) is preferably from 0.3% by mass to 20% by mass based on 100% by mass in total of the gas-barrier resin (a), the inorganic layered compound (b), and the additive (c).

In the preferred embodiment, the gas-barrier multilayer film has an anchor coating layer (B) between the first inorganic thin film layer (A) and the gas-barrier resin composition layer (C). In this case, it is preferred that an anchor coating agent composition for forming the anchor coating layer (B) comprises a silane coupling agent having one or more kinds of organic functional group. In this case, the content of the silane coupling agent in the anchor coating agent composition is preferably from 0.1% by mass to 10% by mass based on 100% by mass of the anchor coating agent composition.

In the preferred embodiment, two or more repeating units are repeated where a multilayered structure comprising the anchor coating layer (B), the gas-barrier resin composition layer (C) and the second inorganic thin film layer (D) forms each of the units.

In the preferred embodiment, the gas-barrier multilayer film has a primer coating layer between the plastic film and the first inorganic thin film layer (A).

Effect of the Invention

According to the present invention, a gas-barrier multilayer film can be obtained that has superior stable gas-barrier properties against oxygen and water vapor for a long term even after prolonged exposure to a high-temperature, high-humidity environment or after a retort treatment and that is high in interlayer adhesion and superior in lamination strength. Especially, such a gas-barrier multilayer film is advantageous in that it exhibits less deterioration in gas-barrier properties as well as interlayer adhesion even if it is subjected to a retort treatment and therefore it is suitable for various applications with high practical usefulness and also is superior in production stability, so that uniform characteristics are easily obtained therewith. Accordingly, such a gas-barrier multilayer film of the present invention can be used suitably also for films for packaging for various foodstuffs, drugs, industrial products, and the like as well as industrial applications such as solar batteries, electronic paper, organic EL elements, and semiconductor elements.

MODE FOR CARRYING OUT THE INVENTION

The gas-barrier multilayer film of the present invention includes (A) a first inorganic thin film layer, (C) a gas-barrier resin composition layer, and (D) a second inorganic thin film layer being stacked in this order with or without intervention of other layers on at least one surface of the plastic film. Hereafter, the gas-barrier multilayer film of the present invention is described layer by layer.

1. Plastic Film

The plastic film to be used in the present invention may be a film that includes an organic macromolecule, it is not particularly limited. Examples of the organic macromolecule include: polyamide, polyolefin, polyvinyl chloride, polyvinylidene chloride, polyvinyl alcohol, total aromatic polyamide, polyamide-imide, polyimide, polyetherimide, polysulfone, polystyrene, and polylactic acid, in addition to the polyester.

Specific examples of the polyesters include polyethylene terephthalate, polybutylene terephthalate, and polyethylene-2,6-naphthalate. Moreover, copolymers containing these polyesters as main components are also usable; when a polyester copolymer is used, aromatic dicarboxylic acids, such as terephthalic acid, isophthalic acid, phthalic acid, and 2,6-naphthalenedicarboxylic acid; polyfunctional carboxylic acids, such as trimellitic acid and pyromellitic acid; aliphatic dicarboxylic acids, such as adipic acid and sebacic acid, and so on are used as its dicarboxylic acid component. As its glycol component, aliphatic glycols, such as ethylene glycol, 1,4-butanediol, diethylene glycol, propylene glycol, and neopentyl glycol; aromatic glycols, such as p-xylylene glycol; alicyclic glycols, such as 1,4-cyclohexanedimethanol; polyethylene glycols having average molecular weights of 150 to 20000; and so on are used.

When the gas-barrier multilayer film of the present invention is used as a barrier film for a solar battery, a barrier film for an organic electroluminescence, or a barrier film for an electronic paper, polyethylene terephthalate or polyethylene naphthalate is preferred as the organic macromolecule resin for constituting the plastic film. In particular, when it is used as a barrier film of a solar battery, the acid value of the plastic film is preferably 10 equivalents/ton or less, more preferably 5 equivalents/ton or less because it is desired to have high resistance to hydrolysis. When the plastic film is constituted by polyethylene terephthalate, the intrinsic viscosity (IV value) of polyethylene terephthalate is preferably 0.60 or more and more preferably 0.65 or more; it is preferably 0.90 or less, and more preferably 0.80 or less. It is noted that the IV value is a value measured at 30° C. in a mixed solvent of phenol/1,1,2,2-tetrachloroethane (with a mass ratio of 6/4). The content of the cyclic trimer in polyethylene terephthalate is preferably 0.7% by mass or less, and more preferably 0.5% by mass or less.

The organic macromolecule that constitutes the plastic film may be further copolymerized with a small amount of other monomers or may be blended with other organic macromolecules, if necessary, unless film strength, transparency, heat resistance, or the like is impaired. Moreover, to the organic macromolecule may be added known additives, such as UV absorbers, antistatic agents, plasticizers, lubricants, and colorants.

The thickness of the plastic film is preferably 1 μm or more, more preferably 2 μm or more, and even more preferably 3 μm or more; it is preferably 500 μm or less, more preferably 300 μm or less, and even more preferably 100 μm or less.

While the transparency of the plastic film is not particularly limited, one having a light transmittance of 50% or more is desirable in use as a packaging material which is desired transparency.

The plastic film can be obtained by, for example, forming a film by melt-extrusion and then, if necessary, subjecting the film to stretching in the longitudinal direction and/or the transverse direction, cooling, and heat setting. As the method for forming a film, known methods, such as extrusion and casting, may be employed.

The plastic film may be either a monolayer film or a multilayer film. The type, the number of layers, the method of lamination, and so on of a film in forming a multilayer film are not particularly limited and may be selected optionally from known methods according to an intended purpose.

Unless the purpose of the present invention is not impaired, the plastic film may be subjected to a surface treatment, such as a corona discharge treatment, glow discharge, a flame treatment, and a surface roughening treatment, and a known anchor coating treatment, printing, or decoration may be applied.

2. First Inorganic Thin Film Layer (A) and Second Inorganic Thin Film Layer (D)

The first inorganic thin film layer (A) and the second inorganic thin film layer (D) are a thin film including metal or an inorganic oxide. A material for forming the metal thin film is not particularly restricted as long as it is one that can be formed into a film; examples thereof include magnesium, aluminum, titanium, chromium, nickel, and indium, and aluminum is preferred from the viewpoints of cost, etc. A material for forming the inorganic oxide thin film is not particularly restricted as long as it is one that can be formed into a film; examples thereof include silicon oxide, aluminum oxide, and magnesium oxide, and silicon oxide, aluminum oxide, and magnesium oxide are preferred. Among these, because of being superior in gas-barrier properties, multi-component inorganic oxide thin films containing silicon oxide and aluminum oxide are more preferred, and silicon oxide/aluminum oxide two-component inorganic oxide thin films are most preferred. The silicon oxide referred herein include mixtures of various types of silicon oxides such as SiO and $SiO_2$; the aluminum oxide referred herein include mixtures of various types of aluminum oxides such as AlO and $Al_2O_3$.

The reason why multi-component inorganic oxide thin films containing silicon oxide and aluminum oxide are superior in gas-barrier properties is that it is possible to change the flexibility and gas-barrier properties of a multi-component inorganic oxide thin film by the proportion of the inorganic substance in the thin film and a good film having well-balanced performance can be obtained. Moreover, that is because when an adhesive layer or a heat seal layer is formed on a second inorganic thin film layer as described later, a high adhesion power is easily obtained between a multi-component inorganic oxide thin film containing silicon oxide and aluminum oxide and the adhesive layer and the heat seal layer is resistant to peeling.

In the silicon oxide/aluminum oxide two-component inorganic oxide thin film, the content of aluminum oxide in the inorganic oxide thin film is preferably 20% by mass or more, more preferably 30% by mass or more, and even more preferably 40% by mass or more; it is preferably 99% by mass or less, more preferably 75% by mass or less, and even more preferably 60% by mass or less. If the content of aluminum oxide in the silicon oxide/aluminum oxide two-component inorganic oxide thin film is 20% by mass or more, gas-barrier properties improve more; if it is 99% by mass or less, the softness of a vapor-deposited film becomes good and a gas-barrier multilayer film becomes stronger against bending or dimensional change, so that an effect of using a two-component system is improved more.

The multi-component inorganic oxide thin film containing silicon oxide and aluminum oxide contains silicon oxide and aluminum oxide and may further contain other inorganic oxides, and such a multi-component inorganic oxide thin film has a great effect as a gas-barrier layered article.

In the event that the inorganic oxide thin film is a silicon oxide/aluminum oxide two-component inorganic oxide thin film, where the relation between the value of the specific gravity of the inorganic oxide thin film and the content (% by mass) of the aluminum oxide in the inorganic oxide thin film is expressed by $D=0.01\,A+b$ (D: the specific gravity of the thin film, A: mass % of the aluminum oxide in the thin film), the value of b is preferably 1.6 to 2.2, more preferably 1.7 to 2.1. Although the value of b is, of course, not limited to this range, when it is within a range smaller than 1.6, the structure of the silicon oxide/aluminum oxide thin film becomes rough, whereas when the value of b is within a range larger than 2.2, the silicon oxide/aluminum oxide two-component inorganic oxide thin film tends to become hard.

In the present invention, the first inorganic thin film layer (A) and the second inorganic thin film layer (D) may have either the same composition or different compositions. Moreover, the first inorganic thin film layer (A) and the second inorganic thin film layer (D) each may have a laminated configuration having two or more layers.

In the present invention, the thickness of the first inorganic thin film layer (A) and the second inorganic thin film layer (D) each are preferably 1 nm or more and more preferably 5 nm or more; it is preferably 800 nm or less and more preferably 500 nm or less. If the thickness is 1 nm or more, gas-barrier properties improve more. Even if the thickness is made excessively greater than 800 nm, any effect of improving in gas-barrier properties equivalent thereto is not obtained.

The method for forming the first inorganic thin film layer (A) and the second inorganic thin film layer (D) are not particularly restricted, and known thin film forming methods such as a vapor deposition technique may be employed appropriately. The method for forming an inorganic thin film layer will be described below by taking a silicon oxide/aluminum oxide two-component inorganic oxide thin film as an example. As a thin film formation method by a vapor deposition technique, physical vapor deposition methods (PVD methods) such as a vacuum vapor deposition method, a sputtering method, and an ion plating method, or chemical vapor deposition methods (CVD methods) are appropriately used. For example, where a vacuum vapor deposition method is employed, a mixture of $SiO_2$ and $Al_2O_3$ or a mixture of $SiO_2$ and Al is used preferably as a raw material for vapor deposition. Although particles are usually used as such raw materials for vapor deposition, each particle is preferably in such a size that the pressure in vapor deposition does not change and a preferred particle diameter is 1 mm to 5 mm. For heating, such systems as resistance heating, high-frequency induction heating, electron beam heating, and laser heating can be employed. Reactive vapor deposition can also be employed in which oxygen, nitrogen, hydrogen, argon, carbon dioxide gas, water vapor, or the like is introduced as a reaction gas or such means as ozone addition or ion assistance is used. Moreover, it is also permitted to optionally change film formation conditions, for example, to add a bias to the substrate (plastic film), or to heat or cool the substrate (plastic film). Likewise, such vapor deposition material, reaction gas, substrate bias, heating/cooling, and so on may be applied also when employing a sputtering method or a CVD method. By methods like those described above, it becomes possible to obtain a gas-barrier multilayer film having superior performance, specifically, being transparent, superior in gas-barrier properties, and capable of withstanding various treatments, such as a boiling treatment and a retort treatment, and a flexure resistance test.

3. Gas-Barrier Resin Composition Layer (C)

In the present invention, the gas-barrier resin composition layer (C) is formed from a gas-barrier resin composition. The gas-barrier resin composition is comprised of a gas-barrier resin (a) including an ethylene-vinyl alcohol-based copolymer (hereinafter may be referred to as "EVOH"), an inorganic layered compound (b), and an additive (c). Hereafter, description is made to each individual component constituting the gas-barrier resin composition.

3-1. Gas-Barrier Resin (a)

Examples of the EVOH that can be used as a gas-barrier resin (a) include products obtainable by saponifying ethylene-vinyl acetate-based copolymers. The ethylene-vinyl acetate-based copolymer is a material obtainable by copolymerizing a monomer component including ethylene, vinyl acetate, and optionally other monomers. In an ethylene-vinyl acetate-based copolymer, the ethylene ratio (content of ethylene) in the monomer component before copolymerization is preferably 20 to 60 mol %, more preferably 20 to 50 mol %. If the ethylene ratio is 20 mol % or more, gas-barrier properties under high-humidity will improve more and drop of lamination strength after a retort treatment will be suppressed more. On the other hand, if the ethylene ratio is 60 mol % or less, gas-barrier properties will improve more. The ethylene-vinyl acetate-based copolymer is preferably one having a degree of saponification of its vinyl acetate component of 95 mol % or more. If the degree of saponification of vinyl acetate component is 95 mol % or more, gas-barrier properties and oil resistance will become better.

The EVOH may be one prepared by applying treatment with a peroxide or the like for molecular chain scission, thereby reducing the molecular weight in order to improve dissolution stability in a solvent. As peroxide that can be used here, examples of the compound include the following type (i) through (vii).
(i) Hydrogen peroxide ($H_2O_2$)
(ii) $M_2O_2$ type (M: Na, K, $NH_4$, Rb, Cs, Ag, Li, etc.)
(iii) M'$O_2$ type (M': Mg, Ca, Sr, Ba, Zn, Cs, Hg, etc.)
(iv) R—O—O—R type (R: an alkyl group; the same shall apply hereinafter): dialkyl peroxides such as diethyl peroxide
(v) R—CO—O—O—CO—R type: acyl peroxides such as diacetyl peroxide, diamyl peroxide, and dibenzoyl peroxide
(vi) Acid peroxide type
a) Acids having an —O—O— linkage: persulfuric acid ($H_2SO_5$), perphosphoric acid ($H_3PO_5$), etc.
b) R—CO—O—OH performic acid, peracetic acid, perbenzoic acid, perphthalic acid, etc.
(vii) Hydrogen peroxide inclusion compounds: $(NaOOH)_2$/$H_2O_2$, $(KOOH)_2$/$3H_2O_2$, etc.

Among these, hydrogen peroxide (i) is particularly preferred because it can be decomposed easily afterwards using a reducing agent, a reducing enzyme, or a catalyst.

A method of treating EVOH with a peroxide is not particularly restricted and known treating methods can be used. Specific examples thereof include a method in which a peroxide and a catalyst for molecular chain scission (e.g., iron sulfate) are added to a solution in which EVOH has been dissolved (this may hereinafter be referred to as an "EVOH solution"), followed by heating at 40 to 90° C. under stirring.

More particularly, in an exemplary method using hydrogen peroxide as a peroxide, hydrogen peroxide (usually 35% by mass aqueous solution) is added to an EVOH solution (for example, the solution which was dissolved in a solvent described later) and treatment is then performed at a temperature of 40° C. to 90° C. for 1 hour to 50 hours under stirring. The added amount of hydrogen peroxide (35% by mass aqueous solution) is approximately 3 parts by mass to 300 parts by mass relative to 100 parts by mass of the EVOH in the solution. In order to adjust the reaction rate of oxidative decomposition, a metal catalyst ($CuCl_2$, $CuSO_4$, $MoO_3$, $FeSO_4$, $TiCl_4$, $SeO_2$, etc.) may also be added in an amount of about 1 ppm to 5000 ppm (on a mass basis; the same shall apply hereinafter) per the EVOH solution as a catalyst for molecular chain scission. The point at which the viscosity of the solution has become about 10% or less of the initial viscosity can be determined as an indication of the end point of such treatment. By removing the solvent from the solution after the end of treatment by known methods, it is possible to obtain a carboxylic acid-terminated EVOH having carboxyl groups of from about 0.03 meq/g to about 0.2 meq/g at molecular terminals.

The content of the gas-barrier resin (a) is preferably 66% by mass or more, more preferably 75% by mass or more, even more preferably 79% by mass or more, and most preferably 83% by mass or more in 100% by mass of the gas-barrier resin (a), the inorganic layered compound (b) and the additive (c) in total, and it is preferably 99.6% by mass or less, more preferably 99% by mass or less, even more preferably 98% by mass or less, and most preferably 91.5% by mass or less. By bringing the content of the gas-barrier resin (a) into the above-described range, drop of lamination strength after prolonged use under high-temperature and high-humidity or a retort treatment can be suppressed more efficiently.

3-2. Inorganic Layered Compound (b)

Examples of the inorganic layered compound (b) include clay minerals (including its synthesized products), such as smectite, kaolin, mica, hydrotalcite, and chlorite. Specific examples thereof include montmorillonite, beidellite, saponite, hectorite, sauconite, stevensite, kaolinite, nacrite, dickite, halloysite, hydrated halloysite, tetrasilylic mica, sodium taeniolite, muscovite, margarite, phlogopite, talc, antigorite, chrysotile, pyrophyllite, vermiculite, xanthophylite, and chlorite. Scaly silica and the like can also be used as the inorganic layered compound (b). Among these, smectite (including its synthesized products) is particularly preferred from the viewpoints of good water vapor barrier property. The inorganic layered compound (b) may be used singly or two or more thereof may be used in combination.

Inorganic layered compounds (b) in which metal ions having redox ability, especially iron ions, are present are preferred. Among such compounds, montmorillonite is preferred from the viewpoints of coatability and gas-barrier properties. As such montmorillonite, known products having been conventionally used as a gas-barrier agent can be used. For example, there can be used montmorillonite group minerals represented by general formula: $(X,Y)_{2-3}Z_4O_{10}$ $(OH)_2 \cdot mH_2O \cdot (W\omega)$,
wherein X represents Al, Fe(III), or Cr(III); Y represents Mg, Fe(II), Mn(II), Ni, Zn, or Li; Z represents Si or Al; W represents K, Na, or Ca; $H_2O$ represents interlayer water; and m and ω each represent a positive real number. Among these, compounds wherein W is Na are preferred from the viewpoint that they are cleaved in an aqueous medium.

Although the size and shape of the inorganic layered compound (b) are not particularly limited, the particle diameter (major axis) is preferably up to 5 μm and the aspect ratio is preferably from 50 to 5000, more preferably from 200 to 3000.

The content of the inorganic layered compound (b) is preferably 0.1% by mass or more, more preferably 0.5% by mass or more, even more preferably 1.0% by mass or more, and particularly preferably 1.2% by mass or more in 100% by mass of the gas-barrier resin (a), the inorganic layered compound (b) and the additive (c) in total, and it is preferably 20% by mass or less, more preferably 7.0% by mass or less, even more preferably 6.0% by mass or less, and particularly preferably 5.0% by mass or less. If the content of the inorganic layered compound (b) is less than 0.1% by mass, gas-barrier properties may deteriorate easily by prolonged use under high-temperature and high-humidity or a retort treatment, or lamination strength after a retort treatment may decrease easily. On the other hand, if the content of the inorganic layered compound (b) exceeds 20% by mass, lamination strength or gas-barrier properties tend to be reduced by prolonged use under high-temperature and high-humidity or a retort treatment. It is surmised that delamination occurs between the inorganic thin film layer and the gas-barrier resin composition layer due to decrease in interlayer peeling strength caused by prolonged use under high-temperature and high-humidity or a retort treatment, or cracks are formed in the gas-barrier resin composition layer by various stresses during use, vibration, the stress of shower water used during a retort treatment, and so on due to decrease in the softness of the gas-barrier resin composition layer, so that gas-barrier properties become easy to deteriorate.

Incidentally, it has been considered that gas-barrier properties are low when the amount of an inorganic layered compound (b) contained in a gas-barrier resin composition layer is small, whereas gas-barrier properties are high when the amount contained is large. In the case of laminating with an inorganic thin film layer as in the present invention, however, high gas-barrier properties are exhibited due to a synergistic effect with an inorganic thin film even if the content of an inorganic layered compound (b) in a gas-barrier resin composition layer is relatively small as above. It is considered that this is probably because a gas-barrier resin composition layer formed on an inorganic thin film layer has functions to fill defects caused by pinholes and cracks of the inorganic thin film and additionally to prevent damages, such as cracking, of the inorganic thin film. And it is considered that a high gas-barrier property can be secured regardless of the content of the inorganic layered compound (b) because it fully fulfills those functions even if the content of the inorganic layered compound (b) is small. On the contrary, it is considered that if the content of the inorganic layered compound (b) increases, such phenomena as a decrease in interlayer adhesion power and a decrease in the softness of a film occur during prolonged use under high-temperature and high-humidity or a retort treatment, resulting in deterioration of a function to prevent the damage of an inorganic thin film, so that an effect to further improve gas-barrier properties is not obtained as a whole, but a decrease in gas-barrier properties is caused.

3-3. Additive (c)

The additive (c) is at least one member selected from coupling agents and crosslinking agents. Such additives (c) contribute to the improvement in interlayer adhesiveness. Although the coupling agent is not particularly restricted as far as it is one capable of being used for resin compositions, silane coupling agents having one or more kinds of organic functional groups (which may henceforth be referred to as "organic functional group-containing silane coupling agents") are preferred, and crosslinking agents for groups capable of forming a hydrogen bond are preferred as the crosslinking agent. Additives (c) may be used singly or may be used in combination of two or more of them.

Examples of the organic functional group which the organic functional group-containing silane coupling agents have include an epoxy group, an amino group, an alkoxy group, and an isocyanate group.

Specific examples of the epoxy group-containing silane coupling agents include 2-(3,4-epoxycyclohexyl)ethyltrimethoxysilane, 2-(3,4-epoxycyclohexyl)ethyltriethoxysilane, 3-(3,4-epoxycyclohexyl)propyltrimethoxysilane, 2-glycidyloxyethyltrimethoxysilane, 2-glycidyloxyethyltriethoxysilane, 3-glycidyloxypropyltrimethoxysilane, and 3-glycidyloxypropyltriethoxysilane.

Examples of the amino group-containing silane coupling agents include 2-aminoethyltrimethoxysilane, 3-aminopropyltrimethoxysilane, 3-aminopropyltriethoxysilane, 2-[N-(2-aminoethyl)amino]ethyltrimethoxysilane, 3-[N-(2-aminoethyl)amino]propyltrimethoxysilane, 3-[N-(2-aminoethyl)amino]propyltriethoxysilane, and 3-[N-(2-aminoethyl)amino]propylmethyldimethoxysilane.

Examples of the alkoxy group-containing silane coupling agents include dimethyldimethoxysilane, dimethyldiethoxysilane, methyltrimetoxysilane, methyltriethoxysilane, ethyltrimethoxysilane, ethyltriethoxysilane, tetramethoxysilane, tetraethoxysilane, tetrapropoxysilane, diphenyldimethoxysilane, diphenyldiethoxysilane, phenyltrimethoxysilane, and phenyltriethoxysilane.

Examples of the isocyanate group-containing silane coupling agents include γ-isocyanatopropyltrimethoxysilane, γ-isocyanatopropyltriethoxysilane, γ-isocyanatopropylmethyldimethoxysilane, and γ-isocyanatopropylmethyldiethoxysilane.

The crosslinking agent for groups capable of forming a hydrogen bond may be any compounds that can interpose between groups capable of forming a hydrogen bond, such as a hydroxyl group and a carboxyl group, and examples thereof include water-soluble zirconium compounds and water-soluble titanium compounds.

Specific example of the water-soluble zirconium compounds include zirconium oxydichloride, zirconium hydroxychloride, basic zirconium sulfate, zirconium nitrate, zirconium ammonium carbonate, zirconium sodium sulfate, zirconium sodium citrate, zirconium lactate, zirconium acetate, zirconium sulfate, zirconium oxysulfate, zirconium oxynitrate, basic zirconium carbonate, zirconium hydroxide, zirconium potassium carbonate, zirconium chloride, zirconium chloride octahydrate, zirconium oxydichloride, monohydroxytris(lactate) zirconium ammonium, tetrakis(lactate) zirconium ammonium, and monohydroxytris(slate) zirconium ammonium. Among these, zirconium oxydichloride and zirconium hydroxychloride are preferred from the viewpoints of the effect of improvement in application cohesive force and the stability as the gas-barrier resin composition for laminating; in particular, zirconium oxydichloride is preferred.

Specific examples of the water-soluble titanium compound include titanium lactate, ammonium titanium lactate, diisopropoxytitanium (triethanolaminate), di-n-butoxytitanium bis(triethanolaminate), diisopropoxytitanium bis(triethanolaminate), and titanium tetrakis(acetylacetonate).

The content of the additive (c) (the total content of a coupling agent and a crosslinking agent) is preferably 0.3% by mass or more, more preferably 0.5% by mass or more, even more preferably 1.0% by mass or more, and most preferably 8% by mass or more in 100% by mass of the gas-barrier resin (a), the inorganic layered compound (b) and the additive (c) in total, and it is preferably 20% by mass or less, more preferably 18% by mass or less, even more preferably 15% by mass or less, and most preferably 12% by mass or less. By bringing the content of the additive (c) into the above-described range, drop of lamination strength after prolonged use under high-temperature and high-humidity or a retort treatment can be suppressed more efficiently.

3-4. Forming Method

Examples of the formation method of a gas-barrier resin composition layer include 1) a method that involves preparing a coating liquid in which the materials to constitute a gas-barrier resin composition are dissolved/dispersed in a solvent and applying this liquid to a surface on which a gas-barrier resin composition layer is to be formed (e.g., the first inorganic thin film layer or an anchor coating layer (B), described later), 2) a method that involves melting a gas-barrier resin composition and extruding the composition onto a surface on which a gas-barrier resin composition layer is to be formed, thereby laminating the composition, and 3) a method that involves forming a film using the materials to constitute a gas-barrier resin composition and sticking this film with an adhesive or the like to a surface on which a gas-barrier resin composition layer is to be formed. Among these, the method 1) using a coating liquid is preferred from the viewpoints of simplicity, productivity, and so on. In this case, it is permitted that an anchor coating layer (B) described later is provided on the first inorganic thin film layer (A) and then a gas-barrier resin composition layer is provided on a surface of the anchor coating layer (B) as a surface on which a gas-barrier resin composition layer is to be formed. Such an anchor coating layer (B) is described later.

Hereafter, the above-described method 1) is described as one example of the method for forming a gas-barrier resin composition layer.

An aqueous or non-aqueous solvent having capable of dissolving EVOH can be used as a solvent for forming a coating liquid from a gas-barrier resin composition; the use of a mixed solvent of water and a lower alcohol is preferred. Specifically, a mixed solvent of water and a lower alcohol having 2 to 4 carbon atoms (ethyl alcohol, n-propyl alcohol, isopropyl alcohol, n-butyl alcohol, iso-butyl alcohol, sec-butyl alcohol, tert-butyl alcohol, etc.) is preferred. If such a mixed solvent is used, the solubility of EVOH becomes good, so that a moderate solid concentration can be maintained. The content of the lower alcohol in the mixed solvent is preferably from 15% by mass to 70% by mass. If the content of the lower alcohol in the mixed solvent is 70% by mass or less, cleavage of the inorganic layered compound proceeds more when the inorganic layered compound (b) is dispersed; if it is 15% by mass or more, the coatability of a coating liquid in which a gas-barrier resin composition has been dissolved or dispersed improves more.

Although the method of dissolving and dispersing a gas-barrier resin composition (the materials to constitute this resin composition) in a solvent is not particularly restricted, for example, as to EVOH to be used as the gas-barrier resin (a) and the inorganic layered compound (b), it is permitted to add the inorganic layered compound (b) (this may, if necessary, have been swollen or cleaved in a dispersion medium, such as water beforehand) into a solution in which the EVOH has been dissolved beforehand, or alternatively it is also permitted to add EVOH (this may, if necessary, have been dissolved in a solvent beforehand) into a dispersion liquid in which the inorganic layered compound (b) has been swollen and cleaved in a dispersion medium, such as water, beforehand. Although the additive (c) may be added at any time and, for example, it may have been added beforehand to the solution of EVOH or the dispersion liquid of the inorganic layered compound (b), from the viewpoint of suppressing the effect of the additive as much as possible, it is preferred to add the additive (c) in a final stage (after mixing the gas-barrier resin (a) and the inorganic layered compound (b)).

In mixing the gas-barrier resin composition (the materials to constitute the resin composition), the inorganic layered compound (b) can be dispersed uniformly by utilizing conventionally known stirring machines or dispersion machines; in order to obtain a particularly transparent, stable dispersion liquid of the inorganic layered compound (b), it is preferred to use a high pressure disperser (e.g., "GAULIN" manufactured by APV Gaulin, "NANOMIZER" manufactured by Nanomizer Inc., "MICROFLUIDIZER" manufactured by Microflydex Co., Ltd., "MULTIMIZER" manufactured by Sugino Machine Limited, and "DeBee" manufactured by BEE International, Inc.). The pressure condition of such a high pressure disperser is preferably adjusted to 100 MPa or lower. If the pressure condition is 100 MPa or lower, pulverization of the inorganic layered compound can be suppressed, so that a desired gas-barrier property becomes good. As to the coating system, conventional systems, such as gravure coating, bar coating, die coating, and spray coating, can be employed according to the property of the coating liquid.

After applying the coating liquid of the gas-barrier resin composition, heat-drying may be applied if necessary. In that case, the drying temperature is preferably 100° C. or higher, more preferably 130° C. or higher, and even more preferably 150° C. or higher while it is preferably 200° C. or lower. If the drying temperature is 100° C. or higher, a coating layer can be dried sufficiently and crystallization and cross-linking of a gas-barrier resin composition layer proceeds, so that gas-barrier properties and lamination strength after prolonged use under high-temperature and high-humidity or a retort treatment become better. On the other hand, if the drying temperature is 200° C. or lower, a plastic film is inhibited from being exposed excessively to heat, so that the film is inhibited from becoming brittle or shrinking and processability becomes good. It is also effective to perform an additional heat treatment in a separate treatment step, specifically an additional heating treatment (150 to 200° C.) while rewinding a film after winding it, or with a roll, or before or during execution of a post process such as a lamination process.

The thickness of a gas-barrier resin composition layer formed by the above-method is preferably 0.01 μm or more, more preferably 0.05 μm or more, and even more preferably 0.08 μm or more; it is preferably 0.70 μm or less, more preferably 0.50 μm or less, and even more preferably 0.30 μm or less. If the thickness is 0.01 μm or more, then gas-barrier properties after prolonged use under high-temperature and high-humidity or a retort treatment improve more, and if it is 0.70 μm or less, then the layer becomes easy to dry even if a coating liquid is used and lamination strength increases more.

4. Anchor Coating Layer (B)

It is preferred for the gas-barrier multilayer film of the present invention to have an anchor coating layer (B) between the first inorganic thin film layer (A) and the gas-barrier resin composition layer (C). Inclusion of such an anchor coating layer (B) makes it possible to increase the adhesive force between the first inorganic thin film layer (A) and the gas-barrier resin composition layer (C). The location of the anchor coating layer (B) is not restricted to between the first inorganic thin film layer (A) and the gas-barrier resin composition layer (C) and it may be provided, for example, between the gas-barrier resin composition layer (C) and the second inorganic thin film layer (D).

The anchor coating layer is formed from a coating liquid for anchor coating layer containing an anchor coating agent composition and a solvent. Examples of the anchor coating agent composition include compositions prepared by adding a curing agent, such as an epoxy-based curing agent, an isocyanate-based curing agent, or a melamine-based curing agent, to a resin such as a urethane-based resin, a polyester-based resin, an acrylic resin, a titanium-based resin, an isocyanate-based resin, an imine-based resin, or a polybutadiene-based resin. Examples the solvent include aromatic solvents, such as benzene and toluene; alcohol solvents, such as methanol and ethanol; ketone solvents, such as acetone and methyl ethyl ketone; ester solvents, such as ethyl acetate and butyl acetate; polyhydric alcohol derivatives, such as ethylene glycol monomethyl ether.

It is preferred that the anchor coating agent composition contain a silane coupling agent having one or more kinds of organic functional groups. Examples of the organic functional group include an alkoxy group, an amino group, an epoxy group, and an isocyanate group. Specific examples of such silane coupling agents are the same as the silane coupling agents provided as examples of the additive (c) to constitute the gas-barrier resin composition. The content of the silane coupling agent is preferably 0.1% by mass or more, more preferably 3% by mass or more in 100% by mass of the anchor coating agent composition (the resin, the curing agent and the silane coupling agent) in total; it is preferably 10% by mass or less, more preferably 7% by mass or less. If the content of the silane coupling agent in the anchor coating agent composition is 0.1% by mass or more, lamination strength after a retort treatment will increase more, and if it is 10% by mass or less, very good water vapor barrier property can be held.

The thickness of the anchor coating layer is preferably 0.01 µm or more, more preferably 0.05 µm or more, and even more preferably 0.10 µm or more, most preferably 0.15 µm or more; it is preferably 0.7 µm or less, more preferably 0.5 µm or less, and even more preferably 0.3 µm or less. If the thickness of the anchor coating layer is 0.01 µm or more, a decrease in lamination strength caused by retort treatment is suppressed more; if it is 0.7 µm or less, uneven coating does not occur, so that gas-barrier properties become better.

5. Primer Coating Layer

It is preferred for the gas-barrier multilayer film of the present invention to have a primer coating layer between the plastic film and the first inorganic thin film layer (A). Inclusion of such a primer coating layer makes it possible to increase the planarity of the gas-barrier multilayer film and to further increase the adhesive force between the plastic film and the first inorganic thin film layer (A).

The primer coating layer can be formed from a coating liquid for a primer coating layer in which a resin component for constituting the primer coating layer has been dissolved or dispersed. Examples of the resin for constituting the primer coating layer include a polyurethane resin and a copolymerized polyester resin. In particular, it is preferred to use a polyurethane resin and a copolymerized polyester resin in combination as the resin for constituting the primer coating layer.

The polyurethane resin can be obtained by, for example, reacting a polyisocyanate compound, a polyol compound, a polyhydroxy acid, a chain extender, and so on. From the viewpoint of coating property to plastic films, examples of the polyisocyanate compound preferably include araliphatic diisocyanates and alicyclic diisocyanates, and especially metaxylylene diisocyanate (MXDI) and hydrogenated xylylene diisocyanate (hydrogenated XDI) are preferred in respect of oxygen barrier property and water vapor barrier property. Moreover, a use of MXDI and hydrogenated XDI in combination has an advantage that self-crosslinking becomes easy to proceed. Although polyol compounds ranging from low-molecular weight glycols to oligomers can be used as the polyol compound, alkylene glycols such as ethylene glycol are usually preferable from the viewpoint of gas-barrier properties. Examples of the polyhydroxy acid include dimethylol propionic acid and dimethylol butanoic acid. Examples of the chain extender include hydroxyl group-containing diamines such as 2-[(2-aminoethyl)amino] ethanol and 2-aminoethylaminopropanol. The method for producing the polyurethane resin is not particularly restricted and the polyurethane resin may be prepared with the use of a common technique for making a polyurethane resin aqueous, such as an acetone method or a prepolymer method. Moreover, in the urethanization reaction to be performed in producing the polyurethane resin, a urethanizing catalyst, such as an amine-based catalyst, a tin-based catalyst, or a lead-based catalyst, may be used, if necessary.

Preferably, the polyurethane resin is high in total concentration of urethane groups and urea groups and has an acid group. From the viewpoint of gas-barrier properties, the total concentration of the urethane groups and the urea groups of the polyurethane resin is preferably from 15% by mass to 60% by mass. The urethane group concentration and the urea group concentration each mean the value obtained by dividing the molecular weight of a urethane group (59 g/equivalent) or the molecular weight of a urea group (primary amino group (amino group): 58 g/equivalent, secondary amino group (imino group): 57 g/equivalent) by the molecular weight of a repeating constitutional unit structure. The acid value of the polyurethane resin, which may be adjusted as far as solubility in water or dispersibility in water can be imparted, is usually preferably from 5 mgKOH/g to 100 mgKOH/g.

From the viewpoint of impartation of dispersibility in water, the copolymerized polyester resin is preferably a polymer having a hydrophilic group, such as a carboxyl group or a salt thereof or a sulfonic acid group or a salt thereof, or is preferably a hydrophilic grafted polymer. The copolymerized polyester resin can be obtained by, for example, subjecting a carboxylate, such as dimethyl terephthalate or dimethyl isophthalate, and a polyol compound, such as neopentyl glycol or ethylene glycol, to a transesterification reaction and then further performing an esterification reaction with a polycarboxylic acid, such as fumaric acid.

When the polyurethane resin and the copolymerized polyester resin are used together as resin components to constitute a primer coating layer, the ratio of the polyurethane resin to the copolymerized polyester resin is preferably polyurethane resin/copolymerized polyester resin (mass ratio)=10/90 to 70/30, more preferably 15/85 to 50/50. Adhesion properties to plastic films are more improved by bringing the ratio of the polyurethane resin to the copolymerized polyester resin into the above-described range.

The coating liquid for primer coating layers may contain a solvent. For example, when the polyurethane resin or the copolymerized polyester resin is used as a resin component, from the viewpoint of the solubility or dispersibility thereof, in addition the uniformity in coating of a primer layer to be formed and safety in production, it is preferred to use a solvent composed solely of water or a water/lower alcohol mixed solvent as a solvent. The total solid content concentration of the coating liquid for primer coating layers is preferably from 2% by mass to 35% by mass.

The coating liquid for primer coating layers may contain, in addition to resin components and a solvent, various known inorganic or organic additives, such as antistatic agents, slipping agents, and anti-blocking agents, if necessary.

The method of forming a primer coating layer on a plastic film is not particularly restricted. A method may be adopted from among commonly known methods for applying a water-based solution according to the viscosity or amount to be applied of the coating liquid for primer coating layers; for example, the fountain bar coating method can be adopted.

From the viewpoint of gas-barrier properties or economical efficiency, the thickness of the primer coating layer is preferably 0.1 µm or more and is preferably 0.5 µm or less, more preferably 0.3 µm or less. If the thickness of the primer coating layer is 0.1 µm or more, then the resultant will be superior in gas-barrier properties, especially water vapor barrier property, whereas if it is 0.5 µm or less, then self-crosslinking of the primer coating layer will proceed well, resulting in improved gas-barrier properties.

6. Multilayered Configuration

The gas-barrier multilayer film of the present invention has at least a first inorganic thin film layer (A)/a gas-barrier resin composition layer (C)/a second inorganic thin film layer (D) in order from the plastic film side, but it is not limited to this multilayered configuration and may be combined appropriately, for example with the above-described anchor coating layer (B). Examples of such multilayered configurations include embodiment (i): first inorganic thin film layer (A)/anchor coating layer (B)/gas-barrier resin composition layer (C)/second inorganic thin film layer (D); and embodiment (ii): first inorganic thin film layer (A)/first anchor coating layer (B1)/first gas-barrier resin composition layer (C1)/second inorganic thin film layer (D)/second anchor coating layer (B2)/second gas-barrier resin composition layer (C2). Of these, embodiment (i) is preferred.

Moreover, in a multilayered configuration of the gas-barrier multilayer film of the present invention, it is also permitted to combine a primer coating layer and an embodiment in which a primer coating layer is provided between a plastic film and a first inorganic thin film layer (A) is also preferred as described above. For example, in the above-described embodiments (i) and (ii), a primer coating layer may be provided between the gas-barrier resin composition layer and the second inorganic thin film layer.

In the gas-barrier multilayer film of the present invention, especially a configuration in which two or more repeating units are repeated where a multilayered structure composed of the anchor coating layer (B), the gas-barrier resin composition layer (C) and the second inorganic thin film layer (D) forms each of the units is also one preferred embodiment.

In the events that two or more layers of the same type, such as the anchor coating layer (B), the gas-barrier resin composition layer (C) and the second inorganic thin film layer (D) in this embodiment or the anchor coating layer in the above-described embodiment (ii), are laminated in a multilayered configuration, the respective layers may be either the same or different in composition.

Furthermore, in the gas-barrier multilayer film of the present invention, the above-described layers may be provided on both sides of the plastic film. In this case, both the sides may be either the same or different in multilayered configuration or in composition of the respective layers.

7. Lamination with Other Films, Etc.

The gas-barrier multilayer film of the present invention can be used for various applications including food packaging application and can be further provided with one or more layers such as a heat seal layer, a printing layer, other resin films, and an adhesive layer for bonding these layers in conformity with such an intended application. In lamination of such other layers, there can be employed known means, such as a method involving direct melt-extrusion lamination onto any layer of the gas-barrier multilayer film of the present invention, a method by coating, a method involving laminating films directly or via an adhesive. When high barrier properties are required, two or more gas-barrier multilayer films of the present invention may be laminated.

For example, when using as a retortable pouch or the like or a cover material of a retorted food, it is preferred to form a heat seal layer of polyethylene, polypropylene or the like on a second inorganic thin film layer (D). It is also permitted to laminate other resin films between the gas-barrier resin composition layer (C) and the heat seal layer. As the other resin films, resin films exemplified as plastic films can be used. In the lamination thereof, they can be laminated via an adhesive.

In use for a solar battery, the gas-barrier multilayer film of the present invention can be used as a back sheet with lamination with a weather resistant film, such as a fluorine-based film or a hydrolysis resistant polyester film, a light-reflective white film, a black-colored film, or the like. In use as a film on the light-receiving side of a solar battery, the gas-barrier multilayer film of the present invention may be applied to an anti-fouling coat, an anti-reflection coat, an anti-glare coat, a hard coat, etc. or other films to be applied such coat may be laminated. Also in applications such as organic EL and electronic paper, an anti-fouling coat, an anti-reflection coat, an anti-glare coat, a hard coat, etc. may be applied or other films to be applied such coat may be laminated. Such other coat and other films may be provided on whichever side of the gas-barrier multilayer film of the present invention.

EXAMPLES

The present invention will be described in detail below by way of examples, but the present invention is not limited by the following examples, and modifications which do not depart from the gist of the present invention are allowed and embraced within the technical scope of the present invention.

1. Evaluation Methods

1-1. Preparation of Laminated Gas-Barrier Multilayer Film for Evaluation

Laminated gas-barrier multilayer films for evaluation (they are henceforth sometimes referred to as "laminated films for evaluation") were obtained by laminating a non-stretched polypropylene film ("P1147" produced by Toyobo Co., Ltd.: 70 μm in thickness) as a heat seal layer on the second inorganic thin film layer of each of the gas-barrier multilayer films Nos. 1 through 17 (the gas-barrier resin composition layers for Nos. 13 and 17) by the dry lamination process using a urethane-based two-component curable adhesive, followed by aging at 40° C. for four days. The thickness after desiccation of the adhesive layer formed by the urethane-based two-component curable adhesive was 3 μm.

1-2. Method of Measuring Lamination Strength

A laminated film for evaluation was cut into a size of 15 mm in width and 200 mm in length to form a specimen and the lamination strength (before a retort treatment) thereof was measured under conditions including a temperature of 23° C. and a relative humidity of 65% by using a TENSILON universal material testing instrument ("TENSILON UMT-II-500" manufactured by Toyo Baldwin Co., Ltd.). Water was applied to between the gas-barrier multilayer film and a non-stretched polypropylene film and then the strength at the time of peeling the films at a peeling angle of 90 degrees was measured with a tensile speed adjusted to 200 mm/minute.

On the other hand, a laminated film for evaluation was subjected to a retort treatment for 30 minutes that involved holding the film in water vapor having a temperature of 121° C. and a pressure of 0.2 MPa (2 kgf/cm$^2$) and subsequently was dried at 40° C. for 24 hours, and then a specimen was cut from the resulting laminated film after the retort treatment in the same procedures as described above, followed by measurement of lamination strength (after a retort treatment).

1-3. Oxygen Permeability

For a laminated film for evaluation, the oxygen permeability (before a retort treatment) was measured under an atmosphere represented by a temperature of 23° C. and a humidity of 65% RH by using an oxygen permeability analyzer ("OX-TRAN 2/20" manufactured by MOCON) according to the electrolysis sensor method (appendix A) of JIS K7126-2.

On the other hand, a laminated film for evaluation was subjected to a retort treatment for 30 minutes that involved holding the film in water vapor having a temperature of 121° C. and a pressure of 0.2 MPa (2 kgf/cm$^2$) and subsequently was dried at 40° C. for 24 hours, and then the oxygen permeability (after a retort treatment) of the resulting laminated film after the retort treatment was measured in the same procedures as described above.

1-4. Water Vapor Permeability Measurement

For a laminated film for evaluation, the water vapor permeability (before a retort treatment) was measured under an atmosphere represented by a temperature of 40° C. and a humidity of 100% RH by using a water vapor permeability analyzer ("PERMATRAN-W 3/33MG" manufactured by MOCON) according to the JIS K7129-B method. In the measurement, the laminated film for evaluation was humidity controlled with the film being placed so that water vapor would permeate from the plastic film side toward the gas-barrier resin composition layer side of the film.

2. Preparation 2-1. Preparation of Plastic Film

Polyethylene terephthalate (PET) having an intrinsic viscosity of 0.62 (30° C., phenol/tetrachloroethane (mass ratio) =60/40) and containing 100 ppm of silica was preliminarily crystallized, then dried, subsequently extruded at 280° C. by using an extruder equipped with a T-shaped die, and then rapidly cooled and solidified on a drum having a surface temperature of 40° C., so that an amorphous sheet was obtained. Next, this amorphous sheet was four-fold stretched in the longitudinal direction at 100° C. between a heating roll and a chill roll, so that a uniaxially stretched PET film was obtained as a plastic film.

2-2. Preparation of Coating Liquid for Forming Primer Coating Layer 45.59 parts by mass of meta-xylylene diisocyanate (MXDI), 93.9 parts by mass of hydrogenated xylylene diisocyanate (hydrogenated XDI (1,3-bis(isocyanatemethyl) cyclohexane)), 24.8 parts by mass of ethylene glycol, 13.4 parts by mass of dimethylol propionic acid, and 80.2 parts by mass of methyl ethyl ketone as a solvent were mixed and then made to react at 70° C. for 5 hours under a nitrogen atmosphere. The resulting carboxyl group-containing urethane prepolymer solution was neutralized with 9.6 parts by mass of triethylamine at 40° C. This urethane prepolymer solution was dispersed in 624.8 parts by mass of water by HOMO-DISPER and then subjected to a chain elongation reaction using 21.1 parts by mass of 2-[(2-aminoethyl) amino]ethanol, followed by distillation of methyl ethyl ketone, thereby affording a polyurethane resin, dispersed in water, having a solid content of 25% by mass and an average particle diameter of 90 nm. The acid value of this resin was 26.9 mgKOH/g and the sum total of the urethane group concentration and the urea group concentration was 39.6% by mass. The resin was diluted with water, thereby forming an aqueous polyurethane resin dispersion with a solid content of 15% by mass.

On the other hand, 466 parts by mass of dimethyl terephthalate, 466 parts by mass of dimethyl isophthalate, 401 parts by mass of neopentyl glycol, 443 parts by mass of ethylene glycol, and 0.52 parts by mass of tetra-n-butyl titanate were charged into a stainless steel autoclave equipped with a stirrer, a thermometer, and a partial refluxing condenser, followed by execution of a transesterification reaction from 160° C. to 220° C. over 4 hours. Subsequently, 23 parts by mass of fumaric acid was added and then the temperature was increased from 200° C. to 220° C. over 1 hour, so that an esterification reaction was performed. Subsequently, the temperature was raised to 255° C. and the pressure in the reaction system was reduced slowly, followed by execution of a reaction under a pressure of 26.7 Pa (0.2 mmHg) for 1 hour and 30 minutes. Then, 19 parts by mass of trimellitic anhydride was added and stirred at 220° C. under a nitrogen atmosphere for 1 hour, so that a copolymerized polyester resin was obtained. The resulting copolymerized polyester resin was pale yellow in color and transparent and had a weight average molecular weight of 12000.

Next, a reactor equipped with a stirrer, a thermometer, a refluxing device, and a quantitative dropping device was charged with 75 parts by mass of the copolymerized polyester resin obtained above, 56 parts by mass of methyl ethyl ketone, and 19 parts by mass of isopropyl alcohol and heated at 65° C. with stirring, thereby dissolving the resin. After complete dissolution of the resin, a solution prepared by dissolving a mixture of 17.5 parts by mass of methacrylic acid and 7.5 parts by mass of ethyl acrylate and 1.2 parts by mass of azobisdimethylvaleronitrile in 25 parts by mass of methyl ethyl ketone was dropped into the completely dissolved copolymerized polyester resin solution at a rate of 0.2 mL/min, and stirring was continued for additional 2 hours after completion of the dropping. Subsequently, 300 parts by mass of water and 25 parts by mass of triethylamine were added to the resulting reaction solution and stirred for 1 hour, so that a dispersion of a grafted polyester was obtained. The temperature of the resulting dispersion was raised to 100° C. and thereby methyl ethyl ketone, isopropyl alcohol, and excess triethylamine were removed by distillation, so that an aqueous copolymerized polyester dispersion was obtained. The copolymerized polyester resin particles in the resulting dispersion were white in color and had an average particle diameter of 300 nm and a B type viscosity at 25° C. of 50 cps. This was diluted with water, thereby forming an aqueous copolymerized polyester resin dispersion with a solid content of 25% by mass.

The aqueous polyurethane resin dispersion and the aqueous copolymerized polyester resin dispersion were mixed so that the ratio of the polyurethane resin to the copolymerized polyester resin might become polyurethane resin/polyester resin (mass ratio)=20/80, and then the mixture was diluted with water, thereby forming a coating liquid for primer coating layers, the liquid having a solid content of 10% by mass.

2-3. Preparation of Coating Liquid for Forming Anchor Coating Layer

An isocyanate-based curing agent ("TAKELAC (registered trademark) A-50", produced by Mitsui Chemicals, Inc.) was added to a urethane-based resin ("TAKELAC (registered trademark) A525-S", produced by Mitsui Chemicals, Inc.) and a solid concentration was adjusted to 6.5% by mass using ethyl acetate as a solvent. To this was added an epoxy-based silane coupling agent ("KBM403", produced by Shin-Etsu Chemical Co., Ltd.) so that the content thereof in a resin composition for anchor coating (100% by mass of the resin, the curing agent, and the silane coupling agent in total) might become 5% by mass, thereby affording a resin composition as a coating liquid for an anchor coating layer (a resin composition for anchor coating).

2-4. Preparation of Material of Gas-Barrier Resin Composition Layer

<Preparation of Ethylene-Vinyl Alcohol-Based Copolymer Solution>

To a mixed solvent of 20.996 parts by mass of purified water and 51 parts by mass of n-propyl alcohol (NPA) was added 15 parts by mass of an ethylene-vinyl alcohol copolymer ("SG-525", produced by The Nippon Synthetic Chemical Industry Co., Ltd; a polymer prepared by saponifying an ethylene-vinyl acetate copolymer, ethylene content: 26 mol %; degree of saponification of vinyl acetate component: about 100%, (hereinafter, this may be abbreviated as "EVOH")). Moreover, 13 parts by mass of an aqueous hydrogen peroxide solution (concentration: 30% by mass) and 0.004 parts by mass of iron sulfate ($FeSO_4$) were added and heated up to 80° C. with stirring, followed by a reaction for about 2 hours. Following subsequent cooling of reaction solution, catalase was added so that its concentration might become 3000 ppm and residual hydrogen peroxide was removed, so that an approximately transparent ethylene-vinyl alcohol-based copolymer solution (EVOH solution) having a solid content of 15% by mass was obtained.

<Preparation of Polyvinyl Alcohol Resin Solution>

To 70 parts by mass of a mixed solvent made of 40% by mass of purified water and 60% by mass of n-propyl alcohol (NPA) was added and dissolved 30 parts by mass of completely saponified polyvinyl alcohol resin ("Gosenol (registered trademark) NL-05", produced by The Nippon Synthetic Chemical Industry Co., Ltd.; degree of saponification: 99.5% or more), so that a transparent polyvinyl alcohol resin solution (PVA solution) having a solid content of 30% by mass was obtained.

<Preparation of Inorganic Layered Compound Dispersion Liquid>

Into 96 parts by mass of purified water was added with stirring 4 parts by mass of montmorillonite ("Kunipia (registered trademark) F", produced by Kunimine Industries Co., Ltd.), an inorganic layered compound, which was then fully dispersed under a set pressure of 50 MPa by using a high pressure dispersion apparatus. Then, it was held at 40° C. for one day, thereby affording an inorganic layered compound dispersion liquid having a solid content of 4% by mass.

<Additives>

Cross-linking agent: zirconium oxydichloride ("Zircosol (registered trademark) Zc-20", produced by Daiichi Kigenso Kagaku Kogyo Co., Ltd.; solid content: 20% by mass)

Cross-linking agent: titanium lactate ("ORGATIX (registered trademark) TC-310", produced by Matsumoto Fine Chemical Co., Ltd.; solid content: about 45% by mass)

Silane coupling agent: 3-glycidoxypropyltriethoxysilane ("KBE-403", produced by Shin-Etsu Chemical Co., Ltd.; solid content: 100% by mass)

2-5. Preparation of Coating Liquid for Forming Gas-Barrier Resin Composition Layer Preparation Example 1

To 62.30 parts by mass of a mixed solvent A (purified water:n-propyl alcohol (mass ratio)=40:60) was added 31.75 parts by mass of an EVOH solution, followed by fully stirring and mixing. In addition, to this solution was added 5.95 parts by mass of an inorganic layered compound dispersion liquid with high speed stirring. To 100 parts by mass of this dispersion liquid was added 3 parts by mass of a cation exchange resin, followed by stirring for one hour at such a stirring speed that no breakage of the ion exchange resin occurred, thereby removing cations, and then only the cation exchange resin was removed by filtration using a strainer.

The dispersion liquid prepared by the above-described operations was subjected further to a dispersion treatment under a set pressure of 50 MPa using a high-pressure dispersion apparatus. To 97 parts by mass of the mixed liquid resulting from the dispersion treatment were added 0.75 parts by mass of a cross-linking agent (zirconium oxydichloride) as an additive, 0.9 parts by mass of purified water, and 1.35 parts by mass of NPA, followed by mixing and stirring, and then the resultant was filtered through a 255-mesh filter (opening: 60 μm), so that coating liquid No. 1 having a solid content of 5% by mass for forming a gas-barrier resin composition layer was obtained.

Preparation Example 2

Coating liquid No. 2 having a solid content of 5% by mass for forming a gas-barrier resin composition layer was obtained in the same manner as in Preparation Example 1 except for changing the used amounts of the mixed solvent A, the EVOH solution, and the inorganic layered compound dispersion liquid to 65.76 parts by mass of the mixed solvent A, 33.00 parts by mass of the EVOH solution, and 1.24 parts by mass of the inorganic layered compound dispersion liquid.

Preparation Example 3

Coating liquid No. 3 having a solid content of 5% by mass for forming a gas-barrier resin composition layer was obtained in the same manner as in Preparation Example 1 except for changing the used amounts of the mixed solvent A, the EVOH solution, and the inorganic layered compound dispersion liquid to 64.00 parts by mass of the mixed solvent A, 32.36 parts by mass of the EVOH solution, and 3.64 parts by mass of the inorganic layered compound dispersion liquid.

Preparation Example 4

Coating liquid No. 4 having a solid content of 5% by mass for forming a gas-barrier resin composition layer was obtained in the same manner as in Preparation Example 1 except for changing the used amounts of the mixed solvent A, the EVOH solution, and the inorganic layered compound dispersion liquid to 66.21 parts by mass of the mixed solvent A, 33.17 parts by mass of the EVOH solution, and 0.62 parts by mass of the inorganic layered compound dispersion liquid.

Preparation Example 5

Coating liquid No. 5 having a solid content of 5% by mass for forming a gas-barrier resin composition layer was obtained in the same manner as in Preparation Example 1 except for changing the used amounts of the mixed solvent A, the EVOH solution, and the inorganic layered compound dispersion liquid to 60.67 parts by mass of the mixed solvent A, 31.15 parts by mass of the EVOH solution, and 8.18 parts by mass of the inorganic layered compound dispersion liquid.

Preparation Example 6

Coating liquid No. 6 having a solid content of 5% by mass for forming a gas-barrier resin composition layer was obtained in the same manner as in Preparation Example 1 except for changing the additive to 0.15 parts by mass of a silane coupling agent (3-glycidoxypropyltriethoxysilane), and the used amounts of the purified water and the NPA to 1.14 parts by mass of the purified water and 1.71 parts by mass of the NPA.

Preparation Example 7

Coating liquid No. 7 having a solid content of 5% by mass for forming a gas-barrier resin composition layer was obtained in the same manner as in Preparation Example 1 except for changing the additive to 0.33 parts by mass of a cross-linking agent (titanium lactate), and the used amounts of the purified water and the NPA to 1.07 parts by mass of the purified water and 1.60 parts by mass of the NPA.

Preparation Example 8

Coating liquid No. 8 having a solid content of 5% by mass for forming a gas-barrier resin composition layer was obtained in the same manner as in Preparation Example 1 except for changing the used amounts of the mixed solvent A, the EVOH solution, and the inorganic layered compound dispersion liquid to 59.10 parts by mass of the mixed solvent A, 30.58 parts by mass of the EVOH solution, and 10.32 parts by mass of the inorganic layered compound dispersion liquid.

Preparation Example 9

To 61.52 parts by mass of a mixed solvent A was added 32.40 parts by mass of an EVOH solution, followed by fully stirring and mixing. In addition, to this solution was added 6.08 parts by mass of an inorganic layered compound dispersion liquid with high speed stirring. To 100 parts by mass of this dispersion liquid was added 3 parts by mass of a cation exchange resin, followed by stirring for one hour at such a stirring speed that no breakage of the ion exchange resin occurred, thereby removing cations, and then only the cation exchange resin was removed by filtration using a strainer.

The dispersion liquid prepared by the above-described operations was subjected further to a dispersion treatment under a set pressure of 50 MPa using a high-pressure dispersion apparatus. To 97 parts by mass of the mixed liquid resulting from the dispersion treatment were added 0.25 parts by mass of a cross-linking agent (zirconium oxydichloride) as additive, and 2.75 parts by mass of the mixed solvent A, followed by mixing and stirring, and then the resultant was filtered through a 255-mesh filter, so that coating liquid No. 9 having a solid content of 5% by mass for forming a gas-barrier resin composition layer was obtained.

Preparation Example 10

To 65.02 parts by mass of a mixed solvent A was added 29.46 parts by mass of an EVOH solution, followed by fully stirring and mixing. In addition, to this solution was added 5.52 parts by mass of an inorganic layered compound dispersion liquid with high speed stirring. To 100 parts by mass of this dispersion liquid was added 3 parts by mass of a cation exchange resin, followed by stirring for one hour at such a stirring speed that no breakage of the ion exchange resin occurred, thereby removing cations, and then only the cation exchange resin was removed by filtration using a strainer.

The dispersion liquid prepared by the above-described operations was subjected further to a dispersion treatment under a set pressure of 50 MPa using a high-pressure dispersion apparatus. To 97 parts by mass of the mixed liquid resulting from the dispersion treatment were added 2.50 parts by mass of a cross-linking agent (zirconium oxydichloride) as additive, and 0.50 parts by mass of the mixed solvent A, followed by mixing and stirring, and then the resultant was filtered through a 255-mesh filter, so that coating liquid No. 10 having a solid content of 5% by mass for forming a gas-barrier resin composition layer was obtained.

Preparation Example 11

To 66.67 parts by mass of a mixed solvent A was added 33.33 parts by mass of an EVOH solution, followed by fully stirring and mixing. In addition, to 100 parts by mass of this dispersion liquid was added 3 parts by mass of a cation exchange resin, followed by stirring for one hour at such a stirring speed that no breakage of the ion exchange resin occurred, thereby removing cations, and then only the cation exchange resin was removed by filtration using a strainer.

To 97 parts by mass of the mixed liquid obtained by the above-described were added 0.75 parts by mass of a cross-linking agent (zirconium oxydichloride) as additive, and 2.25 parts by mass of the mixed solvent A, followed by mixing and stirring, and then the resultant was filtered through a 255-mesh filter, so that coating liquid No. 11 having a solid content of 5% by mass for forming a gas-barrier resin composition layer was obtained.

Preparation Example 12

To 78.17 parts by mass of a mixed solvent A was added 15.87 parts by mass of a polyvinyl alcohol resin solution (PVA solution), followed by fully stirring and mixing. In addition, to this solution was added 5.95 parts by mass of an inorganic layered compound dispersion liquid with high speed stirring. To 100 parts by mass of this dispersion liquid was added 3 parts by mass of a cation exchange resin, followed by stirring for one hour at such a stirring speed that no breakage of the ion exchange resin occurred, thereby removing cations, and then only the cation exchange resin was removed by filtration using a strainer.

The dispersion liquid prepared by the above-described operations was subjected further to a dispersion treatment under a set pressure of 50 MPa using a high-pressure dispersion apparatus. To 97 parts by mass of the mixed liquid resulting from the dispersion treatment were added 0.75 parts by mass of a cross-linking agent (zirconium oxydichloride) as additive, and 2.25 parts by mass of the mixed solvent A, followed by mixing and stirring, and then the resultant was filtered through a 255-mesh filter, so that coating liquid No. 12 having a solid content of 5% by mass for forming a gas-barrier resin composition layer was obtained.

3. Preparation of Gas-Barrier Multilayer Film

Production Example 1

The coating liquid for primer coating layers was charged into a temperature control tank linked to a fountain for discharging the liquid to a film surface and its temperature was controlled to 25° C. with stirring. A fountain was brought into contact with one side of the uniaxially stretched PET film, and a clean liquid resulting from the removal of foreign substances by filtration through a capsule filter with 30p holes made of polypropylene was applied to one side of the uniaxially stretched PET film at a discharge rate of 0.028 m$^3$/min. Subsequently, a smooth bar with a diameter of 14 mm was attached to the surface of the liquid and the coating liquid was scraped so that the thickness of a primer coating layer after stretching might become 0.20 μm. The coating rate (film formation rate) was adjusted to 150 m/min and the rotation speed of the bar associated with coatability was adjusted to 60 rpm (2.6 m/min in circumferential speed) in the same direction as the running direction of the film.

Then, the film was led to a drying zone (tenter) and the solvent was volatilized and dried at a preheating temperature of 100° C. Subsequently, the film was 4.0-fold stretched in the transverse direction at a temperature of 120° C. and then was subjected to a heat setting treatment with 6% relaxation in the transverse direction within a heat setting zone set to 225° C. Although the treatment times at respective temperatures were 3 seconds for a preheating temperature of 100° C., 5 seconds for a stretching temperature of 120° C., and 8 seconds for a heat setting treatment temperature of 225° C., the treatment times are not limited thereto. Then, the film was cooled and its both edges were trimmed, so that a 12-μm thick biaxially stretched PET film was formed continuously over 1000 m or more and thereby a mill roll was obtained. The resulting mill roll was slit over a width of 400 mm and a length of 1000 m and then was wound on a 3-inch paper sleeve, thereby affording a PET film with a primer coating layer.

Then, a two-component inorganic oxide thin film layer of silicon oxide and aluminum oxide (the ratio of silicon oxide/aluminum oxide (mass ratio)=50/50) was formed as the first inorganic thin film layer on the primer coating layer surface of the PET film with the primer coating layer. Specifically, the formation of the two-component inorganic oxide thin film of silicon oxide (silicon dioxide) and aluminum oxide was performed by an electron beam vapor deposition process by using granular $SiO_2$ (99.99% in purity) and $Al_2O_3$ (99.9% in purity) as large as about 3 mm to about 5 mm as vapor deposition sources (vapor deposition materials) and also using an EB (Electron Beam) gun as a heat source. The vapor deposition materials were charged in two separate portions without being mixed, the emission current of the EB gun was adjusted to 1.2 A, and then $SiO_2$ and $Al_2O_3$ were heated on a time sequential basis so that the mass ratio of $SiO_2$ to $Al_2O_3$ might become 50:50. At this time, the film feeding rate, the pressure in vapor deposition, and the temperature of the roll for chilling the film in vapor deposition were adjusted to 30 m/min, 1×10$^{-2}$ Pa, and −10° C., respectively. The thus-obtained first inorganic thin film layer was 27 nm in thickness.

Then, the coating liquid for an anchor coating layer was applied onto the first inorganic thin film layer by a gravure roll coating method and then was dried, so that an anchor coating layer was formed. The thickness of the anchor coating layer after drying was 0.30 μm.

Subsequently, the coating liquid No. 1 for forming gas-barrier resin composition layer was applied onto the anchor coating layer by a gravure roll coating method and then was dried at 160° C., so that a gas-barrier resin composition layer was formed. The thickness of the gas-barrier resin composition layer after drying was 0.25 μm.

Subsequently, a two-component inorganic oxide thin film layer of silicon oxide and aluminum oxide (the proportion of silicon oxide/aluminum oxide (mass ratio)=50/50) was formed as the second inorganic thin film layer on the gas-barrier resin composition layer in the same procedures as for the above-described first inorganic thin film layer, so that a gas-barrier multilayer film No. 1 was obtained. The thickness of the second inorganic thin film layer was 27 nm.

Production Examples 2 Through 10

Gas-barrier multilayer films No. 2 through 10 were produced in the same procedures as in Production Example 1 except for changing the coating liquid for forming gas-barrier resin composition layer to the coating liquid No. 2 through 10 for forming gas-barrier resin composition layer.

Production Example 11

Gas-barrier multilayer film No. 11 was produced by further forming an anchor coating layer, a gas-barrier resin composition layer, and a second inorganic thin film layer in the same procedures as in Production Example 1 on the second inorganic thin film layer of the gas-barrier multilayer film No. 1 produced in Production Example 1.

Production Example 12

Gas-barrier multilayer film No. 12 was produced by further forming an anchor coating layer, a gas-barrier resin composition layer, and a second inorganic thin film layer in the same procedures as in Production Example 1 on the second inorganic thin film layer (outermost layer) of the gas-barrier multilayer film No. 11 produced in Production Example 11.

Production Example 13

Gas-barrier multilayer film No. 13 was produced in the same procedures as in Production Example 1 except that the second inorganic thin film layer was not formed.

Production Example 14

Gas-barrier multilayer film No. 14 was produced in the same procedures as in Production Example 1 except that the gas-barrier resin composition layer was not formed.

Production Examples 15 and 16

Gas-barrier multilayer films No. 15, 16 were produced in the same procedures as in Production Example 1 except for changing the coating liquid for forming gas-barrier resin composition layer to the coating liquid No. 11, 12 for forming gas-barrier resin composition layer.

Production Example 17

Gas-barrier multilayer film No. 17 was produced in the same procedures as in Production Example 1 except that the film feeding speed was adjusted to 16 m/min in forming the first inorganic thin film layer so that the thickness of the first inorganic thin film layer became 50 nm, the pressure in vapor deposition was adjusted to 1×10$^{-2}$ Pa, the temperature of a roll for cooling the film in vapor deposition was adjusted to −10° C., and the second inorganic thin film layer was not formed.

The configurations and evaluation results of the prepared gas-barrier multilayer films Nos. 1 through 17 are shown in Tables 1, 2 and 3. The examples shown in Tables 1 and 2 are the example of the present invention, and the examples shown in Table 3 correspond to the comparative example.

TABLE 1

| | | | | | | Gas-barrier multilayer film No. | | | | | | | |
|---|---|---|---|---|---|---|---|---|---|---|---|---|---|
| | | | | | | 1 | 2 | 3 | 4 | 5 | 6 | 7 | 8 |
| First inorganic thin film layer (A) | Primer layer | | Composition (mass ratio) (Al$_2$O$_3$/SiO$_2$) | | | Present 50/50 | Present 50/50 | Present 50/50 | Present 50/50 | Present 50/50 | Present 50/50 | Present 50/50 | Present 50/50 |
| | | | Thickness (nm) | | | 27 | 27 | 27 | 27 | 27 | 27 | 27 | 27 |
| Repeating unit | Anchor coating layer (B) | Anchor coating agent resin composition | Resin composition | | | Urethane-based adhesive | Urethane-based adhesive | Urethane-based adhesive | Urethane-based adhesive | Urethane-based adhesive | Urethane-based adhesive | Urethane-based adhesive | Urethane-based adhesive |
| | | | Silane coupling agent | Kind | | Epoxy-based | Epoxy-based | Epoxy-based | Epoxy-based | Epoxy-based | Epoxy-based | Epoxy-based | Epoxy-based |
| | | | | Added amount (% by mass) | | 5 | 5 | 5 | 5 | 5 | 5 | 5 | 5 |
| | | Thickness (μm) | | | | 0.3 | 0.3 | 0.3 | 0.3 | 0.3 | 0.3 | 0.3 | 0.3 |
| | Gas-barrier resin composition layer (C) | Gas-barrier resin composition | Copolymer | Kind | | EVOH | EVOH | EVOH | EVOH | EVOH | EVOH | EVOH | EVOH |
| | | | Inorganic layered compound | Kind | | Montmorillonite | Montmorillonite | Montmorillonite | Montmorillonite | Montmorillonite | Montmorillonite | Montmorillonite | Montmorillonite |
| | | | | Added amount (% by mass) | | 4.6 | 1.0 | 2.8 | 0.5 | 6.3 | 4.6 | 4.6 | 8.0 |
| | | | Crosslinking agent | Kind | | Zirconium oxydichloride | Zirconium oxydichloride | Zirconium oxydichloride | Zirconium oxydichloride | Zirconium oxydichloride | — | Titanium lactate | Zirconium oxydichloride |
| | | | | Added amount (% by mass) | | 3.0 | 3.0 | 3.0 | 3.0 | 3.0 | — | 3.0 | 3.0 |
| | | | Coupling | Kind | | — | — | — | — | — | Silane | — | — |

TABLE 1-continued

| | | Gas-barrier multilayer film No. | | | | | | | |
|---|---|---|---|---|---|---|---|---|---|
| | | 1 | 2 | 3 | 4 | 5 | 6 | 7 | 8 |
| agent | | — | — | — | — | — | coupling agent containing isocyanate group | — | — |
| | Added amount (% by mass) | | | | | | 3.0 | | |
| Second inorganic thin film layer (D) | Thickness (μm) | 0.25 | 0.25 | 0.25 | 0.25 | 0.25 | 0.25 | 0.25 | 0.25 |
| | Composition (mass ratio) ($Al_2O_3/SiO_2$) | 50/50 | 50/50 | 50/50 | 50/50 | 50/50 | 50/50 | 50/50 | 50/50 |
| | Thickness (nm) | 27 | 27 | 27 | 27 | 27 | 27 | 27 | 27 |
| Number of lamination of repeating units | | 1 | 1 | 1 | 1 | 1 | 1 | 1 | 1 |
| Number of layers (not including plastic film) | | 5 | 5 | 5 | 5 | 5 | 5 | 5 | 5 |
| Before retort treatment | Lamination strength (N/15 mm) | 4.8 | 6.0 | 5.4 | 5.7 | 4.2 | 4.5 | 4.0 | 4.0 |
| | Oxygen permeability (ml/m²dMPa) | 0.4 | 0.9 | 0.5 | 1.0 | 0.7 | 0.4 | 0.6 | 1.0 |
| | Water vapor permeability (g/m²d) | 0.07 | 0.09 | 0.07 | 0.10 | 0.09 | 0.07 | 0.08 | 0.10 |
| After retort treatment | Lamination strength (N/15 mm) | 3.2 | 4.0 | 3.6 | 3.8 | 3.0 | 3.0 | 2.8 | 2.5 |
| | Oxygen permeability (ml/m²dMPa) | 0.8 | 1.8 | 1.0 | 1.8 | 1.7 | 0.8 | 1.0 | 1.9 |
| | Water vapor permeability (g/m²d) | 0.15 | 0.18 | 0.15 | 0.20 | 0.17 | 0.15 | 0.16 | 0.17 |

TABLE 2

|  |  |  |  | Gas-barrier multilayer film No. | | | |
|---|---|---|---|---|---|---|---|
|  |  |  |  | 9 | 10 | 11 | 12 |
|  |  | Primer layer |  | Present | Present | Present | Present |
| First inorganic thin film layer (A) |  | Composition (mass ratio) (Al$_2$O$_3$/SiO$_2$) |  | 50/50 | 50/50 | 50/50 | 50/50 |
|  |  | Thickness (nm) |  | 27 | 27 | 27 | 27 |
| Repeating unit | Anchor coating layer (B) | Anchor coating agent resin composition | Resin composition | Urethane-based adhesive | Urethane-based adhesive | Urethane-based adhesive | Urethane-based adhesive |
|  |  |  | Silane coupling agent Kind | Epoxy-based | Epoxy-based | Epoxy-based | Isocyanate-based |
|  |  |  | Added amount (% by mass) | 5 | 5 | 5 | 5 |
|  |  | Thickness (μm) |  | 0.3 | 0.3 | 0.3 | 0.3 |
|  | Gas-barrier resin composition layer (C) | Gas-barrier resin composition | Copolymer | EVOH | EVOH | EVOH | EVOH |
|  |  |  | Inorganic layered compound Kind | Montmorillonite | Montmorillonite | Montmorillonite | Montmorillonite |
|  |  |  | Added amount (% by mass) | 4.7 | 4.3 | 4.6 | 4.6 |
|  |  |  | Crosslinking agent Kind | Zirconium oxydichloride | Zirconium oxydichloride | Zirconium oxydichloride | Zirconium oxydichloride |
|  |  |  | Added amount (% by mass) | 1.0 | 10.0 | 3.0 | 3.0 |
|  |  |  | Coupling agent Kind | — | — | — | — |
|  |  |  | Added amount (% by mass) | — | — | — | — |
|  |  | Thickness (μm) |  | 0.25 | 0.25 | 0.25 | 0.25 |
|  | Second inorganic thin film layer (D) | Composition (mass ratio) (Al$_2$O$_3$/SiO$_2$) |  | 50/50 | 50/50 | 50/50 | 50/50 |
|  |  | Thickness (nm) |  | 27 | 27 | 27 | 27 |
|  | Number of lamination of repeating units |  |  | 1 | 1 | 2 | 3 |
|  | Number of layers (not including plastic film) |  |  | 5 | 5 | 8 | 11 |
| Before retort treatment | Lamination strength (N/15 mm) |  |  | 3.8 | 6.1 | 4.8 | 4.7 |
|  | Oxygen permeability (ml/m$^2$dMPa) |  |  | 0.4 | 1.1 | 0.1 | 0.04 |
|  | Water vapor permeability (g/m$^2$d) |  |  | 0.07 | 0.12 | 0.02 | 0.008 |
| After retort treatment | Lamination strength (N/15 mm) |  |  | 2.2 | 4.5 | 3.2 | 3.3 |
|  | Oxygen permeability (ml/m$^2$dMPa) |  |  | 0.7 | 2.0 | 0.7 | 0.3 |
|  | Water vapor permeability (g/m$^2$d) |  |  | 0.15 | 0.20 | 0.10 | 0.08 |

TABLE 3

|  |  |  |  |  | Gas-barrier multilayer film No. | | | | |
|---|---|---|---|---|---|---|---|---|---|
|  |  |  |  |  | 13 | 14 | 15 | 16 | 17 |
|  |  | Primer layer |  |  | Present | Present | Present | Present | Present |
| First inorganic thin film layer (A) |  | Composition (mass ratio) (Al$_2$O$_3$/SiO$_2$) |  |  | 50/50 | 50/50 | 50/50 | 50/50 | 50/50 |
|  |  | Thickness (nm) |  |  | 27 | 27 | 27 | 27 | 50 |
| Repeating unit | Anchor coating layer (B) | Anchor coating agent resin composition | Resin composition |  | Urethane-based adhesive | Urethane-based adhesive | Urethane-based adhesive | Urethane-based adhesive | Urethane-based adhesive |
|  |  |  | Silane coupling agent | Kind | Epoxy-based | Epoxy-based | Epoxy-based | Epoxy-based | Epoxy-based |
|  |  |  |  | Added amount (% by mass) | 5 | 5 | 5 | 5 | 5 |
|  |  | Thickness (μm) |  |  | 0.3 | 0.3 | 0.3 | 0.3 | 0.3 |
|  | Gas-barrier resin composition layer (C) | Gas-barrier resin composition | Copolymer |  | EVOH | — | EVOH | PVH | EVOH |
|  |  |  | Inorganic layered compound | Kind | Montmorillonite | — | — | Montmorillonite | Montmorillonite |
|  |  |  |  | Added amount (% by mass) | 4.6 | — | — | 4.6 | 4.6 |
|  |  |  | Crosslinking agent | Kind | Zirconium oxydichloride | — | Zirconium oxydichloride | Zirconium oxydichloride | Zirconium oxydichloride |
|  |  |  |  | Added amount (% by mass) | 3.0 | — | 3.0 | 3.0 | 3.0 |

TABLE 3-continued

| | | | Gas-barrier multilayer film No. | | | | |
|---|---|---|---|---|---|---|---|
| | | | 13 | 14 | 15 | 16 | 17 |
| | Coupling agent | Kind | — | — | — | — | — |
| | | Added amount (% by mass) | — | — | — | — | — |
| Second inorganic thin film layer (D) | | Thickness (μm) | 0.25 | — | 0.25 | — | 0.25 |
| | | Composition (mass ratio) (Al$_2$O$_3$/SiO$_2$) | — | 50/50 | 50/50 | 50/50 | — |
| | | Thickness (nm) | — | 27 | 27 | 27 | — |
| Number of lamination of repeating units | | | — | — | 1 | — | — |
| Number of layers (not including plastic film) | | | 4 | 4 | 5 | 4 | 4 |
| Before retort treatment | Lamination strength (N/15 mm) | | 5.2 | 7.5 | 3.0 | 2.5 | 5.4 |
| | Oxygen permeability (ml/m$^2$dMPa) | | 4 | 10 | 6 | 6 | 2 |
| | Water vapor permeability (g/m$^2$d) | | 0.6 | 1.9 | 1.6 | 1.7 | 0.3 |
| After retort treatment | Lamination strength (N/15 mm) | | 4.0 | 5.0 | 1.4 | Delamination | 4.2 |
| | Oxygen permeability (ml/m$^2$dMPa) | | 0 | 21 | 18 | | 6 |
| | Water vapor permeability (g/m$^2$d) | | 1.8 | 3.2 | 3.1 | | 1.0 |

Gas-barrier multilayer films Nos. 1 through 12 satisfy the requirements of the present invention. These films exhibited high lamination strength and low values of oxygen permeability and water vapor permeability even after a retort treatment. In particular, the gas-barrier multilayer films Nos. 11 and 12, in which the number of lamination of repeating units is two or more, are particularly superior in oxygen permeability and water vapor permeability after a retort treatment.

While gas-barrier multilayer film No. 13 is one not having a second inorganic thin film layer, gas-barrier multilayer film No. 14 is one not having a gas-barrier resin composition layer, and gas-barrier multilayer film No. 15 is one in which the gas-barrier resin composition does not contain an inorganic layered compound, these all exhibit high values in both oxygen permeability and water vapor permeability. Gas-barrier multilayer film No. 16, which is the case where the gas-barrier resin in the gas-barrier resin composition is polyvinyl alcohol (PVA), exhibited high values in oxygen permeability and water vapor permeability before a retort treatment and the gas-barrier multilayer film and the non-stretched polypropylene film were peeled from each other during the retort treatment. Although gas-barrier multilayer film No. 17 has been increased in the thickness of the first inorganic thin film layer instead of having no second inorganic thin film layer, oxygen permeability and water vapor permeability comparable to those of the present invention can be obtained because it does not have a configuration in which a gas-barrier resin composition layer is sandwiched by a first inorganic thin film layer and a second inorganic thin film layer.

INDUSTRIAL APPLICABILITY

According to the present invention, there can be obtained a gas-barrier multilayer film having superior gas-barrier properties against oxygen and water vapor, being high in interlayer adhesion power, and being superior in lamination strength. In particular, a gas-barrier multilayer film can be obtained which has a small decrease in gas-barrier properties and interlayer adhesion power even through retort treatment and which is suitable for various applications and high in practicality. Moreover, a gas-barrier multilayer film is formed which is superior in production stability and with which uniform characteristics can be obtained easily.

The gas-barrier film of the present invention can be widely used not only in foods packaging for retort but also for applications for packaging for various, such as foods, medicaments, and industrial products, as well as industrial applications, such as solar batteries, electronic papers, organic EL devices, and semiconductor devices.

The invention claimed is:

1. A gas-barrier multilayer film, wherein
    (A) a first inorganic thin film layer, (C) a gas-barrier resin composition layer, and (D) a second inorganic thin film layer are stacked in this order with or without intervention of other layers on at least one surface of a plastic film,
    the gas-barrier resin composition layer (C) is formed from a gas-barrier resin composition comprising (a) a gas-barrier resin consisting of an ethylene-vinyl alcohol copolymer, (b) an inorganic layered compound, and (c) at least one additive selected from the group consisting of coupling agents and crosslinking agents, and the content of the inorganic layered compound (b) in the gas-barrier resin composition is from 0.1% by mass to 7.0% by mass based on 100% by mass in total of the gas-barrier resin (a), the inorganic layered compound (b), and the additive (c), and
    the first inorganic thin film layer (A) and/or the second inorganic thin film layer (D) is a silicon oxide/aluminum oxide two-component inorganic oxide thin film, wherein the content of aluminum oxide is 20% by mass to 75% by mass.

2. The gas-barrier multilayer film according to claim 1, wherein the inorganic layered compound (b) is smectite.

3. The gas-barrier multilayer film according to claim 1, wherein the coupling agent is a silane coupling agent having at least one kind of organic functional group.

4. The gas-barrier multilayer film according to claim 1, wherein the cross-linking agent is a cross-linking agent for a group capable of forming a hydrogen bond.

5. The gas-barrier multilayer film according to claim 1, wherein the content of the additive (c) is from 0.3% by mass to 20% by mass based on 100% by mass in total of the gas-barrier resin (a), the inorganic layered compound (b), and the additive (c).

6. The gas-barrier multilayer film according to claim 1, which has (B) an anchor coating layer between the first inorganic thin film layer (A) and the gas-barrier resin composition layer (C).

7. The gas-barrier multilayer film according to claim 6, wherein an anchor coating agent composition for forming the anchor coating layer (B) comprises a silane coupling agent having at least one kind of organic functional group.

8. The gas-barrier multilayer film according to claim 7, wherein the content of the silane coupling agent in the anchor coating agent composition is from 0.1% by mass to 10% by mass based on 100% by mass of the anchor coating agent composition.

9. The gas-barrier multilayer film according to claim 8, wherein two or more repeating units are repeated where a multilayered structure comprising the anchor coating layer (B), the gas-barrier resin composition layer (C) and the second inorganic thin film layer (D) forms each of the units.

10. The gas-barrier multilayer film according to claim 7, wherein two or more repeating units are repeated where a multilayered structure comprising the anchor coating layer (B), the gas-barrier resin composition layer (C) and the second inorganic thin film layer (D) forms each of the units.

11. The gas-barrier multilayer film according to claim 6, wherein two or more repeating units are repeated where a multilayered structure comprising the anchor coating layer (B), the gas-barrier resin composition layer (C) and the second inorganic thin film layer (D) forms each of the units.

12. The gas-barrier multilayer film according to claim 1, which has a primer coating layer between the plastic film and the first inorganic thin film layer (A).

* * * * *